(12) United States Patent
Yang et al.

(10) Patent No.: US 8,780,067 B1
(45) Date of Patent: Jul. 15, 2014

(54) BRIDGING STRUCTURE FOR SIGNAL TRANSMISSION OF TOUCH PANEL

(71) Applicants: Kai-Ti Yang, Taoyuan (TW); Hsing-Ming Chang, Taoyuan (TW)

(72) Inventors: Kai-Ti Yang, Taoyuan (TW); Hsing-Ming Chang, Taoyuan (TW)

(73) Assignee: Young Fast Optoelectronics Co., Ltd., Taoyuan (TW)

( * ) Notice: Subject to any disclaimer, the term of this patent is extended or adjusted under 35 U.S.C. 154(b) by 14 days.

(21) Appl. No.: 13/737,965

(22) Filed: Jan. 10, 2013

(51) Int. Cl.
*G06F 3/041* (2006.01)
*H05K 1/00* (2006.01)
*H05K 1/18* (2006.01)
*H05K 7/00* (2006.01)

(52) U.S. Cl.
USPC .......................................... 345/173; 361/748

(58) Field of Classification Search
CPC ....... G06F 3/041; G06F 1/1626; G06F 3/044; G06F 2203/04103; G06F 1/1656; G06F 1/1643; G06F 1/169; G06F 3/045; G06F 1/1616; G06F 1/1632; G06F 2203/04111; G06F 1/1601; G06F 2200/1612; G06F 2203/04; G06F 1/16; G06F 1/18; G06F 1/184; G06F 1/185; G06F 1/186; G06F 3/047; G06F 2203/04112; G06F 3/0412; G06F 2203/04107; G06F 2203/04113; G06F 3/0414; G06F 3/0488; H01R 12/721; H05K 7/1454; H05K 3/361
USPC ................. 361/728, 748, 749, 784, 785, 790, 361/679.01, 600, 742, 758, 760; 174/254, 174/260, 261, 267; 439/43–53
See application file for complete search history.

(56) References Cited

U.S. PATENT DOCUMENTS 6,608,756 B2 * 8/2003 Higashida et al. ............ 361/748
2010/0265198 A1 * 10/2010 Kondoh et al. ............... 345/173

OTHER PUBLICATIONS

U.S. Appl. No. 13/572,706, filed Aug. 13, 2012, Kai-Ti Yang, Hsing-Ming Chang, Zhi-Wei Feng.

* cited by examiner

*Primary Examiner* — Jenny L Wagner
*Assistant Examiner* — Ahmad D Barnes

(57) ABSTRACT

The invention includes a substrate with a visible area and a shielded area, a touch panel overlapped on the substrate and having touch sensor units overlapping with the visible area and a bridging layer with an insulating film. The touch sensor units are connected with signal wires to electric contacts corresponding to the shielded area. The insulating film cloaks the signal wires and electric contacts. The insulating film is formed with through holes corresponding to the electric contacts and is provided with bridging wires between every two adjacent through holes for connecting all of the electric contacts.

3 Claims, 7 Drawing Sheets

US 8,780,067 B1

BRIDGING STRUCTURE FOR SIGNAL TRANSMISSION OF TOUCH PANEL

BACKGROUND OF THE INVENTION

1. Technical Field

The invention relates to assembling connection between a touch panel and a signal transmission cable.

2. Related Art

A conventional touch panel module includes a transparent substrate and a touch panel overlapping thereon. A central portion of the touch panel is defined as a touch sensing area and its surround is defined as a circuit area. The circuit area is disposed with signal wires connected to the touch sensing area. The circuit area is provided with a connecting portion of an electric contact so that the signal wires can be connected to the electric contacts. The connecting portion is attached to a flexible flat cable (FFC) so as to make electric connection therebetween. As a result, signals from the touch sensing area can be transmitted to a signal processing circuit through the signal wires and FFC.

However, modern electronic devices always tend to be smaller, lighter, thinner and shorter. The structure of an electronic device becomes more and more accurate and its outline also becomes more and more various. Particularly for the design of panel, the bigger the display is and the smaller the frame is, the better a product is. To satisfy this requirement, width of the circuit area surrounding the touch panel must be reduced. However, this is seriously adverse to the circuit area with the connecting portion because layout of the signal wires will be constricted. And the size of the connecting portion must be reduced. As a result, the manufacturing accuracy and difficulty will be elevated and the yield rate will be receded. Also, the connection between a shrunk connecting portion and the FFC tends to be unstable or infirm. This will cause a problem of transmission.

U.S. patent application Ser. No. 13/572,706, which is a copending application filed by the same inventors, discloses a signal wiring arrangement of touch panel as shown in FIG. 10. In '706, the connecting portion is flexibly extended to the outside of the circuit area of the touch panel to connect with an FFC. Such an arrangement can shrink required layout space of the circuit area, narrow down frame width and enlarge the size of the connecting portion. However, a newly developed electronic device usually requires dozens of or even a hundred transmission lines. The arrangement of '706 is still at risk of line breakage and alignment error.

SUMMARY OF THE INVENTION

An object of the invention is to provide a bridging structure for signal transmission of a touch panel, which effectively reduces the quantity of electric contacts connecting with the flexible flat cable (FFC), shrink the size of the FFC and enlarge the possible arrangement area of the electric contacts. As a result, the assembling stability and accuracy can be increased, the manufacturing difficulty can be receded and the yield rate can be elevated.

To accomplish the above object, the bridging structure for signal transmission of a touch panel of the invention includes a transparent substrate, provided with an insulating colored periphery so as to be defined as a central visible area and a surrounding shielded area; a transparent touch panel, overlapped on the transparent substrate, and having a plurality of touch sensor units overlapping with the visible area, wherein each of the touch sensor units is connected with a first signal wire to a first electric contact located on the touch panel and overlapping with the shielded area, the touch panel is further provided with second electric contacts and third electric contacts, which are connected with a second signal wire and overlap with the shielded area; a bridging layer, having an insulating film cloaking the first electric contact and the second electric contact, wherein the insulating film is formed with through holes corresponding to the first and second electric contacts and is provided with a bridging wire between two adjacent through holes on the same axis for connecting all of the first electric contacts on the same axis to the second electric contact; and a flexible flat cable, having a flexible base sheet with a plurality of fourth electric contacts corresponding to the third electric contacts. The second electric contacts separately electrically connect with third signal wires. The flexible flat cable is attached to an edge of the shielded area to correspondingly coupling the fourth electric contacts and the third electric contacts.

DETAILED DESCRIPTION OF THE INVENTION

The invention includes a transparent substrate 1, a transparent touch panel 2, a bridging layer 3 and a flexible flat cable (FFC) 4.

Figure 1:
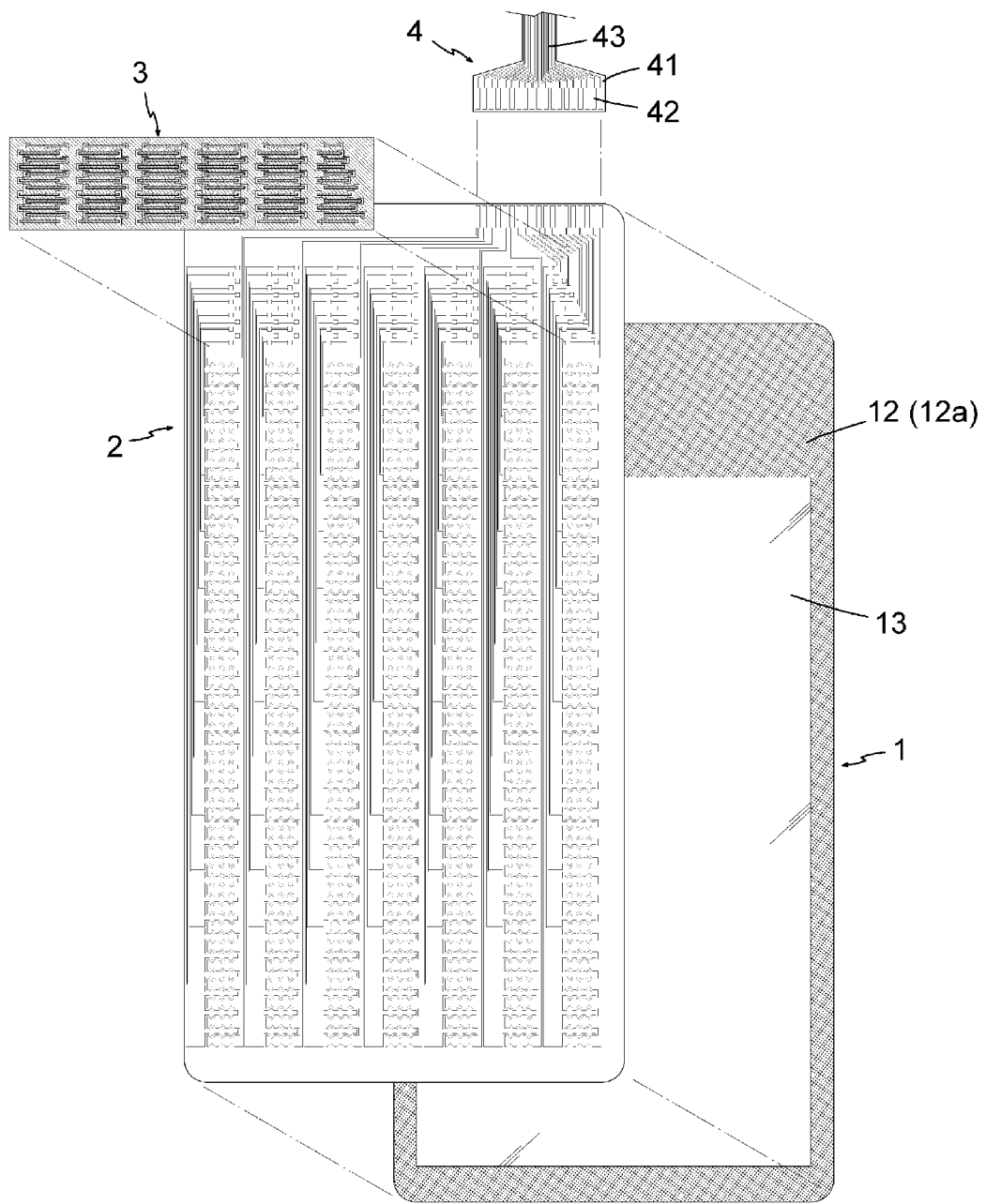
FIG. 1 is an exploded view of the invention.
Figure 2:
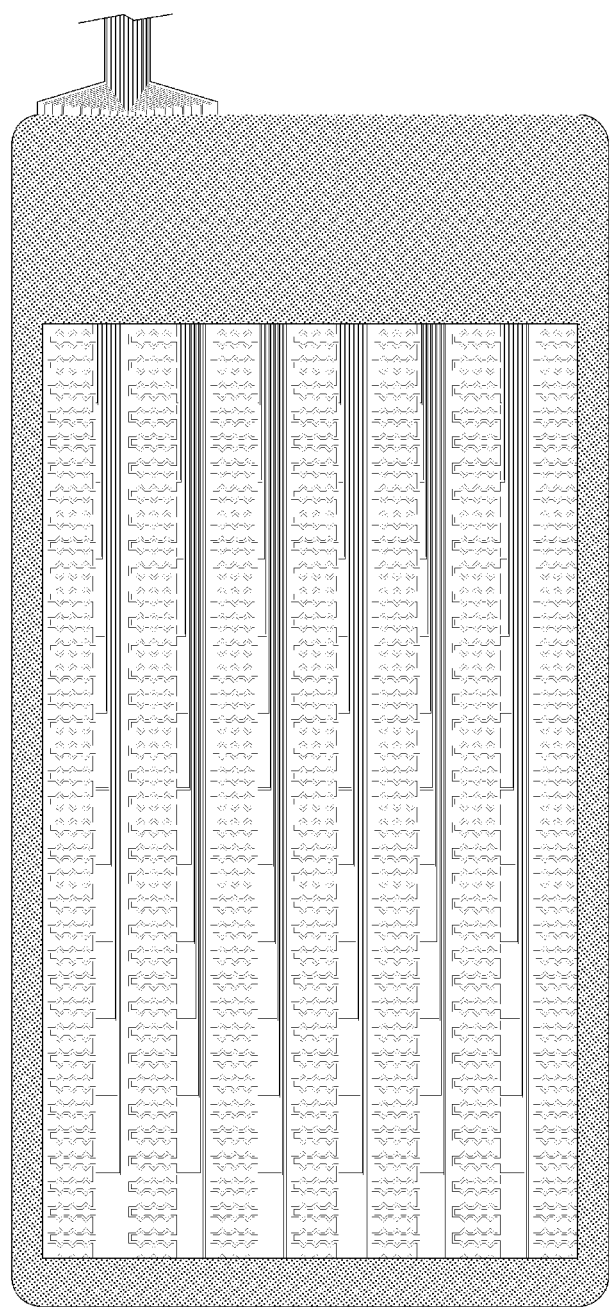
FIG. 2 is a front view of the invention.

Please refer to FIGS. 1 and 2. The substrate 1 is a thin sheet with great mechanical strength and is made of, but not limited to, glass, polymethylmethacrylate (PMMA), polycarbonate (PC), polyethylene terephthalate (PET) or cyclic olefin copolymer (COC). A surface of the substrate 1 is provided with a colored periphery 12 which is an opaque film formed by an insulating material. The insulating material may be, but not limited to, ink or photoresist. The opaque film is made by printing or coating and has a thickness of about 15 µm. Usually, width of the colored periphery 12 is less than 3 mm to satisfy the requirement of thin-framed panel. By means of the colored periphery 12, a central visible area 13 and a surrounding shielded area 13 are defined.

Figure 3:
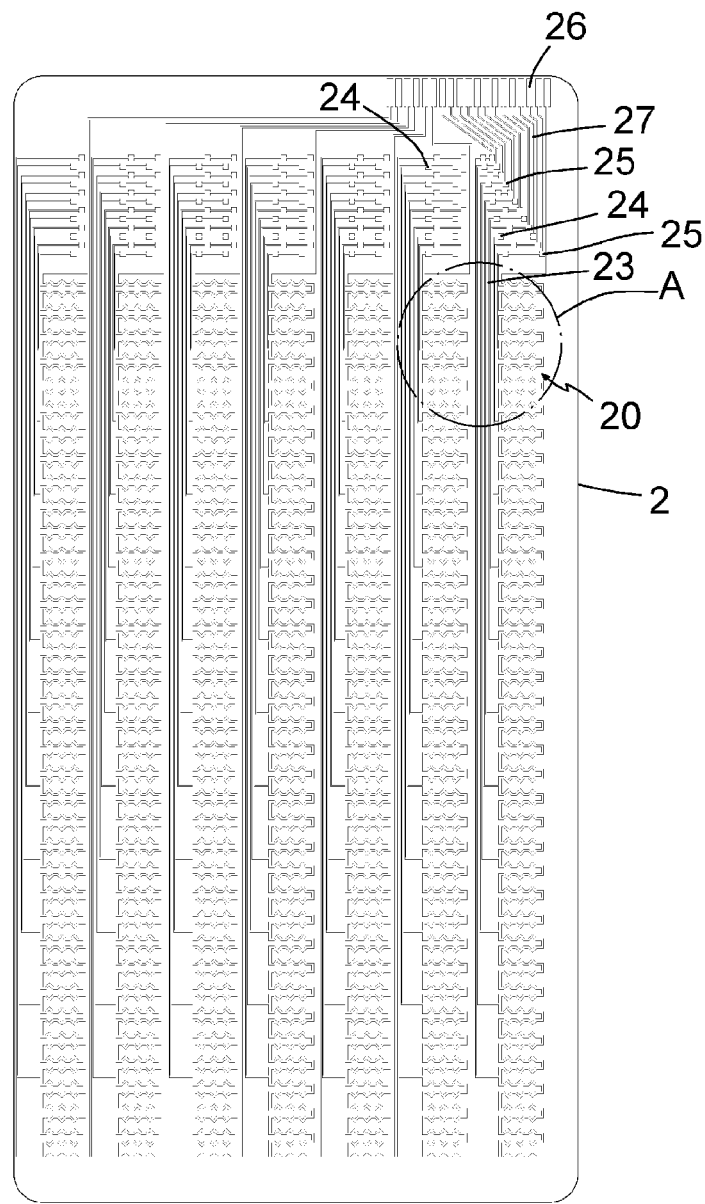
FIG. 3 is a layout view of the touch panel
Figure 4:
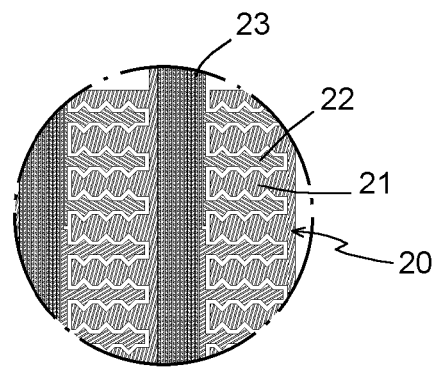
FIG. 4 is a partial enlarged view of the circle A in FIG. 3.
Figure 5:
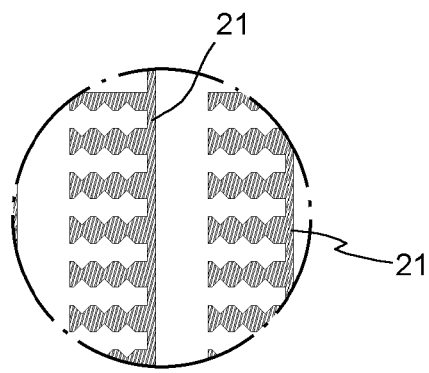
FIG. 5 is a partial layout view of the driving electrodes of the circle A in FIG. 3.
Figure 6:
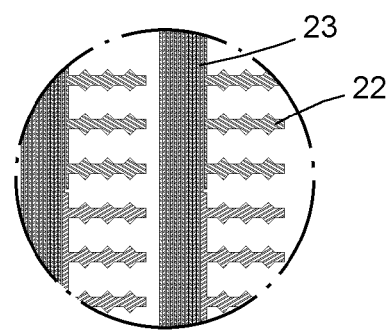
FIG. 6 is a partial layout view of the induction electrodes of the circle A in FIG. 3.

Please refer to FIGS. 3-6. The touch panel 2 is a mutual capacitive touchscreen composed of touch sensor units 20 arranged in a matrix as shown in FIG. 3, each of the touch sensor units 20 includes a driving electrode 21 as shown in FIG. 5 and an induction electrode 22 as shown in FIG. 6. The driving electrodes 21 and induction electrodes 22 are interlaced in position as shown in FIG. 4 and are connected with first signal wires 23 to first electric contacts 24 on and edge of the touch panel 2. The touch panel 2 is completely overlapped on the substrate 1. The touch sensor units 20 are located within the visible area 13. The first electric contacts 24 as well as second electric contacts 25 and third electric contacts 26 are located within the shielded area 12a. The first electric contacts 24 are separately electrically connected to the touch sensor units 20 by the first signal wires 23 and the second electric contacts 25 are separately electrically connected to the third electric contacts 26 by second signal wires 27. The touch panel 2 is made of a material with high light-transmittance and is made of indium tin oxide, indium zinc oxide, zinc aluminum oxide or polyethylenedioxythiophene (PEDT). The circuit on the touch panel 2 may be formed by etching or laser means.

Figure 7:
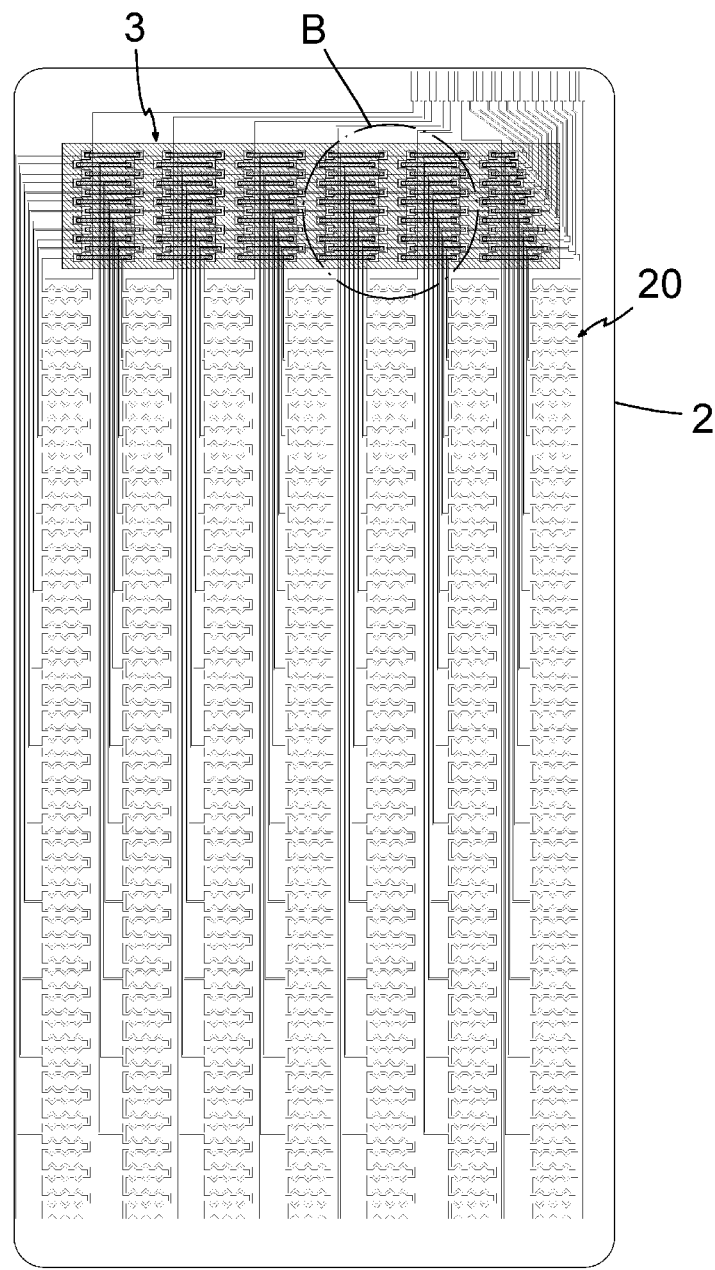
FIG. 7 is a schematic view showing the combination of the touch panel and bridging layer.
Figure 8:
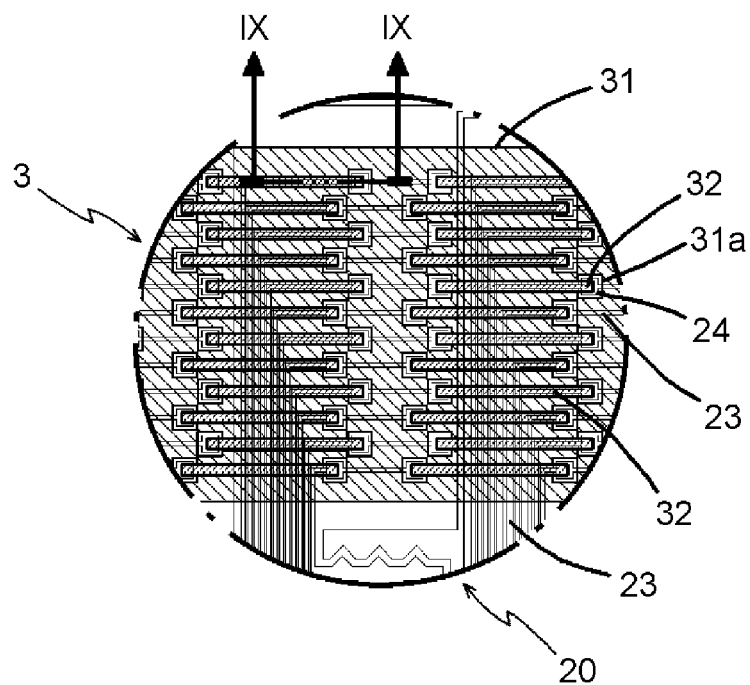
FIG. 8 is a partial enlarged view of the circle B in FIG. 7.
Figure 9:
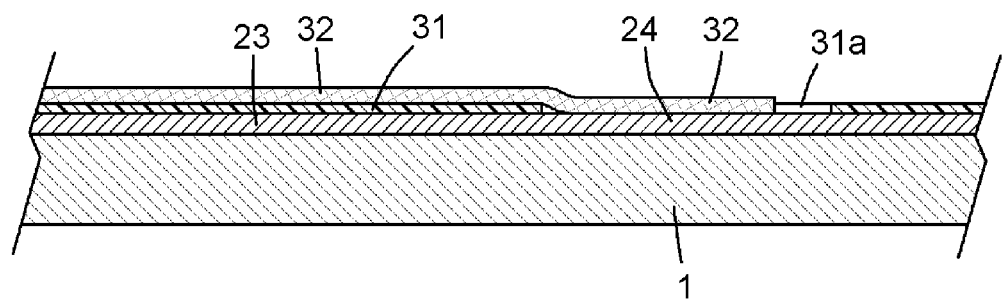
FIG. 9 is a cross sectional view along line IX-IX in FIG. 8.
Figure 10:
FIG. 10 shows a conventional signal wiring arrangement of touch panel.

Please refer to FIGS. 7-9. The bridging layer 3 is disposed within the shielded area 12a and has an insulating film 31. The insulating film 31 covers the first and second electric contacts 24, 25 and is formed with through holes 31a. The insulating film 31 is further provided with bridging wires 32 separately and parallelly arranged between two adjacent through holes 31a on the same X-axis so as to separately electrically connect the first electric contacts 24 exposed in the through holes 31a with the second electric contacts 25 exposed in the through holes 31a, in which the first and second electric contacts 24, 25 are located at two opposite sides of a bundle of the first signal wires 23.

The FFC 4 is a flexible print circuit (FPC) based on a base sheet 41 with electric contacts 42 and third signal wires 43 connected therewith. As shown in FIGS. 1 and 2, a front end of the FFC 4 is firmly attached onto the shielded area 12a so that electric contacts 42 of the FFC 4 can be coupled to the third electric contacts 26. Thus signals from the touch panel 2 can be delivered to a signal processing circuit (not shown) through the FFC 4.

It is noted that the invention may be applied to not only capacitive touchscreens but also other types of touchscreens, such as resistive or electromagnetic or any other types. Additionally, in the above embodiment, the touch sensor units 20 are diminutively shown in the figures and the first signal wires 23, electric contacts 24, 25 and 26 are enlarged for clear expression.

According the above description, the invention uses the bridging layer 3 to effectively reduce the quantity of first electric contacts 24 connecting with the FFC 4 so as to shrink the size of the FFC 4 and enlarge the possible arrangement area of the electric contacts. As a result, the assembling stability and accuracy can be increased, the manufacturing difficulty can be receded and the yield rate can be elevated.

While the forgoing is directed to preferred embodiments of the present invention, other and further embodiments of the invention may be devised without departing from the basic scope thereof. As such, the appropriate scope of the invention is to be determined according to the claims.

What is claimed is:

1. A bridging structure for signal transmission of a touch panel, comprising:
    a transparent substrate, provided with an insulating colored periphery so as to be defined as a central visible area and a surrounding shielded area;
    a transparent touch panel, overlapped on the transparent substrate, and having a plurality of touch sensor units overlapping with the visible area, wherein each of the touch sensor units is connected with a first signal wire to a first electric contact located on the touch panel and overlapping with the shielded area, the touch panel is further provided with second electric contacts and third electric contacts, which are connected with second signal wires and overlap with the shielded area;
    a bridging layer, having an insulating film cloaking the first electric contacts and the second electric contacts, wherein the insulating film is formed with through holes corresponding to the first and second electric contacts and is provided with bridging wires separately between every two adjacent ones of the through holes on the same axis for separately connecting the first electric contacts to the second electric contacts on the same axis; and
    a flexible flat cable, having a flexible base sheet with a plurality of fourth electric contacts corresponding to the third electric contacts;
    wherein the second electric contacts separately and electrically connect with third signal wires, the flexible flat cable is attached to an edge of the shielded area to correspondingly couple the fourth electric contacts and the third electric contacts.

2. The bridging structure of claim 1, wherein the first and second electric contacts are located at two opposite sides of a bundle of the first signal wires.

3. The bridging structure of claim 1, wherein the bridging wires are parallel.

* * * * *